United States Patent
Wood

[19]

[11] Patent Number: 6,002,213
[45] Date of Patent: Dec. 14, 1999

[54] MOS GATE DRIVER CIRCUIT WITH ANALOG INPUT AND VARIABLE DEAD TIME BAND

[75] Inventor: Peter N. Wood, Rolling Hills Estates, Calif.

[73] Assignee: International Rectifier Corporation, El Segundo, Calif.

[21] Appl. No.: 08/713,729

[22] Filed: Sep. 13, 1996

Related U.S. Application Data

[60] Provisional application No. 60/004,841, Oct. 5, 1995.

[51] Int. Cl.⁶ .................................................. H05B 37/02
[52] U.S. Cl. ................................. 315/307; 315/DIG. 7; 315/DIG. 4; 315/DIG. 224
[58] Field of Search .................. 315/DIG. 4, DIG. 7, 315/307, 224

[56] References Cited

U.S. PATENT DOCUMENTS

| | | | |
|---|---|---|---|
| 4,827,391 | 5/1989 | Sills | 363/41 |
| 4,937,505 | 6/1990 | Deglon et al. | 315/307 |
| 5,083,065 | 1/1992 | Sakata et al. | 315/307 |
| 5,303,140 | 4/1994 | Shimizu | 363/132 |
| 5,349,273 | 9/1994 | Pacholok | 315/307 |
| 5,545,955 | 8/1996 | Wood | 315/224 |
| 5,550,436 | 8/1996 | Houk | 315/209 R |
| 5,612,594 | 3/1997 | Maheshwari | 315/307 |

FOREIGN PATENT DOCUMENTS

| | | |
|---|---|---|
| 60-5756 | 2/1985 | Japan . |
| 1532273 | 11/1978 | United Kingdom . |
| 2112230 | 7/1983 | United Kingdom . |
| 2216689 | 3/1989 | United Kingdom . |
| 2287143 | 2/1995 | United Kingdom . |

OTHER PUBLICATIONS

IBM Technical Disclosure Bulletin, vol. 24, No. 7B, Dec. 1981, pp. 3887 and 3888—Overlap Prevention for Switching Regulators.

*Primary Examiner*—Michael B Shingleton
*Attorney, Agent, or Firm*—Ostrolenk, Faber, Gerb & Soffen, LLP

[57] ABSTRACT

A MOS gate drive (MGD) integrated circuit drives a pair of MOS gated power semiconductor devices such as are used in a half bridge circuit to drive a load in a resonant power supply circuit or to drive a gas discharge lamp in a ballast circuit. The gate drive circuit includes dead time circuitry which prevents simultaneous conduction in both MOS gated devices. The duration of the dead time is controlled in response to a feedback signal that is sensed from the output supplied to the load or the lamp. A dimming function is attained by controlling the voltage of the feedback signal.

32 Claims, 5 Drawing Sheets

FIG. 4A
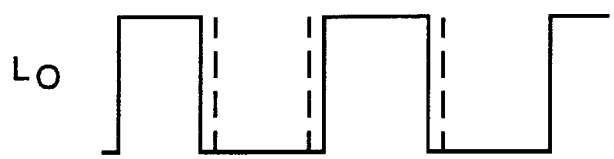
FIG. 4B
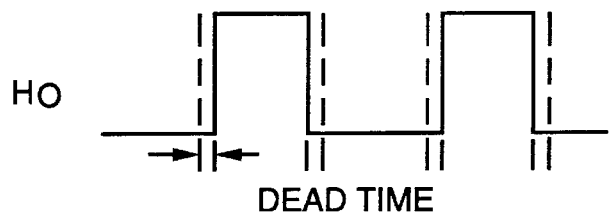
FIG. 4C
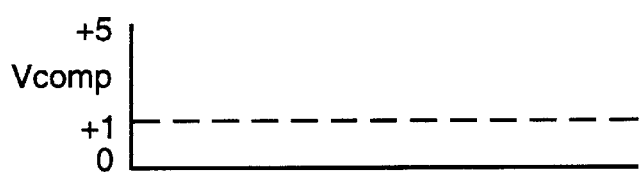
FIG. 4D
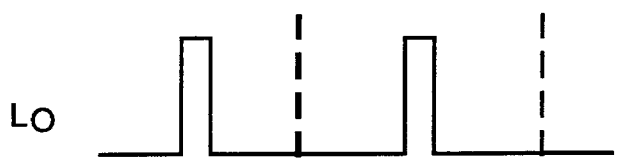
FIG. 4E
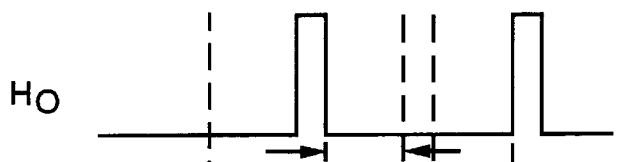
FIG. 4F
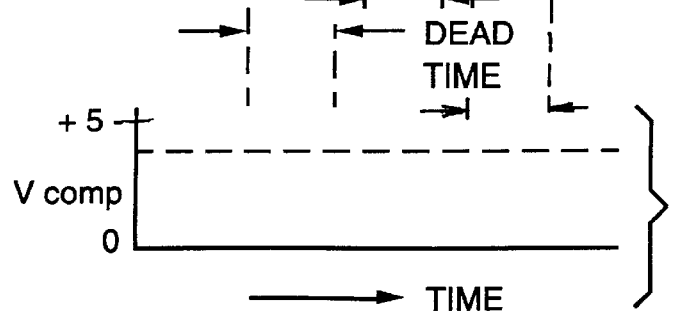
FIG. 4G
FIG. 4H

MOS GATE DRIVER CIRCUIT WITH ANALOG INPUT AND VARIABLE DEAD TIME BAND

RELATED APPLICATIONS

This application is related to application Ser. No. 08/365,831, filed Dec. 29, 1994, entitled "OSCILLATING DRIVER CIRCUIT WITH POWER FACTOR CORRECTION, ELECTRONIC LAMP BALLAST EMPLOYING SAME AND DRIVER METHOD", to application Ser. No. 08/206,123, filed Mar. 4, 1994, entitled "MOS GATE DRIVER FOR BALLAST CIRCUITS", now U.S. Pat. No. 5,545,955, issued Aug. 13, 1996, both in the name of the present inventor, and to application Ser. No. 08/299,561, filed Sep. 1, 1994, entitled "MOS GATE DRIVER INTEGRATED CIRCUIT FOR BALLAST CIRCUITS", now U.S. Pat. No. 5,550,436, issued Aug. 27, 1996, in the name of Talbott M. Houk, all of which are assigned to the assignee of the present application.

BACKGROUND OF THE INVENTION

The present invention is directed to a gate driver integrated circuit for driving MOS gated devices and, more particularly, to a gate driver integrated circuit suitable for use in a resonant power supplies or in electronic ballast circuits.

Electronic ballast circuits for driving fluorescent lamps or other gas discharge illumination devices are coming into widespread use because of the availability of power MOSFET switching devices to replace the previously used bipolar transistor devices. Typically, the electronic ballast circuit uses two power MOSFET switches in a totem pole (half bridge) arrangement which includes one or more LC series resonance circuits and in which the lamp or lamps are connected across one of the reactances of the LC circuit. The power MOSFET switches are driven to conduct alternately by inputs from the secondary windings of a current transformer whose primary winding conducts the current of the lamp circuits. The primary winding current alternates at the resonance frequency of the resonant circuit.

Recently, integrated circuit MOS gate driver devices (MGDs) have been introduced in place of the current transformers. These integrated circuit devices drive the power MOSFETs and IGBTs of an inverter circuit in the ballast circuit from logic level ground referenced inputs and provide a self-oscillating function which is particularly suited for use in electronic lamp ballast circuits. The integrated circuit devices significantly save cost, weight and space when compared to driver circuits employing current transformers.

An example of an MGD is the IR2155 device available from International Rectifier Corporation. This device provides a self oscillating function which has been found to be particularly suited for use in inverter circuits such as are used in electronic lamp ballast circuits.

The MGDs typically have alternating high side and low side outputs for driving the two half bridge power MOSFET switches. Internal circuitry is generally included to provide a fixed, predefined dead time between the alternating high side and low side outputs. The IR2155 MGD, for example, provides a nominal 1.2μ sec dead time between outputs. The value of the predefined dead time, however, could be fixed depending on the particular application of the MGD to 1) prevent cross-conduction currents from flowing in the half bridge switches, and 2) allow an external "snubber" circuit to control the half bridge output voltage slew rate to reduce radiated EMI noise.

It is desirable, however, to have the capability of varying the dead time of the MGD. By varying the dead time, the width of the output pulses supplied to the half bridge switch can be varied, thereby changing the on-time of the respective switches. As a result, the energy supplied also changes.

Moreover, the resonant frequency of the load of a power supply circuit, such as that of the lamps in a ballast circuit, may also change over time. It is therefore also desirable to be able to change the dead time of the circuit to shift the on-time of the switches to synchronize with this change in dead time. Thus, it is desirable that the dead time be controlled in a feedback arrangement from the load.

It is further desirable that the dead time control circuitry be incorporated into the same monolithic integrated circuit that includes the MGD.

SUMMARY OF THE INVENTION

According to an aspect of the present invention, an integrated circuit is formed in a silicon substrate and drives a pair of MOS gated power semiconductor devices. The MOS gated devices are connected in a half bridge circuit which has a pair of d-c terminals. A common terminal is located at a node between the pair of MOS gated device and supplies an output signal to a load circuit. A timer includes an input control that can be connected to a low logic level signal. A latch circuit is coupled to the timer circuit and controls the frequency at which the MOS gated devices are switched on and off and supplies an output that is switched in response to the signal that is applied to the input control terminal. High and low side dead time delay circuits are each coupled to the latch circuit and delay transmission of the latch output signal for a time delay interval following the switching of the latch circuit output. The time delay prevents simultaneous conduction in the NOS gated devices. High and low side driver circuits are respectively coupled to the high and low side dead time circuits and have high side and low side output terminals which supply outputs for respectively turning on and off the MOS gated devices in response to the input control terminal signals. A dead band control circuit supplies a dead time control signal to the dead time delay circuits in response to a feedback signal that is derived from the output supplied to the load circuit and controls the duration of the time delay interval.

In accordance with this aspect of the present invention, the feedback signal may be a fraction of a voltage sensed from the output supply to the load circuit. The feedback signal may be supplied by an external sensing circuit which senses a voltage from the output to the load circuit and which may include at least one voltage divider.

The dead band control circuit may include a transconductance amplifier which compares the feedback signal to a reference voltage and generates the dead time control signal based thereon. The transconductance amplifier may be frequency versus gain compensated by an external capacitor that is coupled between an output of the transconductance amplifier and the ground terminal. The dead time control signal may be proportional to the dead time interval, and the value of the time delay interval may range from about 500 nsec to ½f, where f is the switching frequency.

The timer circuit may have a second input control terminal to control the frequency at which the MOS gated devices are turned on and off, and the first and second control terminals may be connected to an external timing capacitor and an external timing resistor to set the oscillation frequency of the timing circuit.

In accordance with another aspect of the present invention, a circuit drives a load circuit from a d-c bus supply. A pair of MOS gated power semiconductor devices are connected in a half bridge configuration and have first and second d-c terminals coupled across a d-c bus to supply and have a common terminal at the node between the MOS gated devices for supplying an output signal to the load circuit. A sensing circuit is electrically coupled to the load circuit and generates a feedback voltage that is derived from the output supplied to the load circuit. A self-oscillating driver circuit has a pair of outputs which respectively drive the pair of MOS gated devices. A dead time delay circuit prevents the simultaneous driving of the MOS gated devices by delaying the turning on of one of the devices for a time delay interval after the other one is turned off. A dead band control circuit supplies a dead time control signal to the dead time delay circuit in response to the feedback voltage and thus controls the duration of the time delay interval.

In accordance with this aspect of the present invention, the dead band control circuit modulates the output to the load circuit by generating the dead time control signal to change the duration of the time delay interval in response to the size of the load circuit.

A series LC circuit may be coupled across the common terminal and a ground terminal, and the oscillating frequency of the load circuit is controlled by the resonant frequency of the series LC circuit. The series LC circuit may include a capacitor and the primary winding of a transformer with the load circuit coupled across the secondary winding. The sensing circuit may sense the voltage across the transformer primary winding. A zero crossing detector may be coupled to the series LC circuit, the ground terminal and an input control terminal of the driver circuit to maintain the oscillation frequency of the load circuit at the resonant frequency of the LC circuit.

In accordance with a further aspect of the present invention, a circuit drives a gas discharge illumination device and includes first and second MOS gated power semiconductor devices, a sensing circuit, and a self-oscillating driver circuit.

According to this aspect of the present invention, the sensing circuit may include a variable resistor that controls the value of the feedback voltage and thus comprises a dimming control. The sensing circuit may sense the voltage across the illumination device. Alternatively, the sensing circuit senses the current through the illumination device.

Other features and advantages of the present invention will become apparent from the following description of the invention which refers to the accompanying drawings.

BRIEF DESCRIPTION OF THE DRAWINGS

The invention will now be described in greater detail in the following detailed description with reference to the drawings in which:

FIGS. 4A–4H show the wave forms of the MGD circuit of FIG. 1;

DETAILED DESCRIPTION OF THE INVENTION

The present invention is directed to a MOS gate driver integrated circuit which has a feedback input that is a fraction of the voltage to be regulated and which compares the feedback voltage to a reference voltage. The error voltage thus produced is used to control the circuit dead time.

This feature can be incorporated into an integrated circuit which is self-oscillating and which has characteristics similar to those of the IR 2155 driver chip sold by International Rectifier Corporation of El Segundo, Calif. In some aspects, the IR 2155 may be considered to be similar to a device which includes a 555 type front end, low side and high side alternating outputs, a built in minimum dead time of 500 nsec, an internal zener for offline VCC supply, bootstrap operation and under-voltage (UV) lockout with a hysteresis of 8V<VCC<14V where VCC is the operating voltage.

Figure 1:
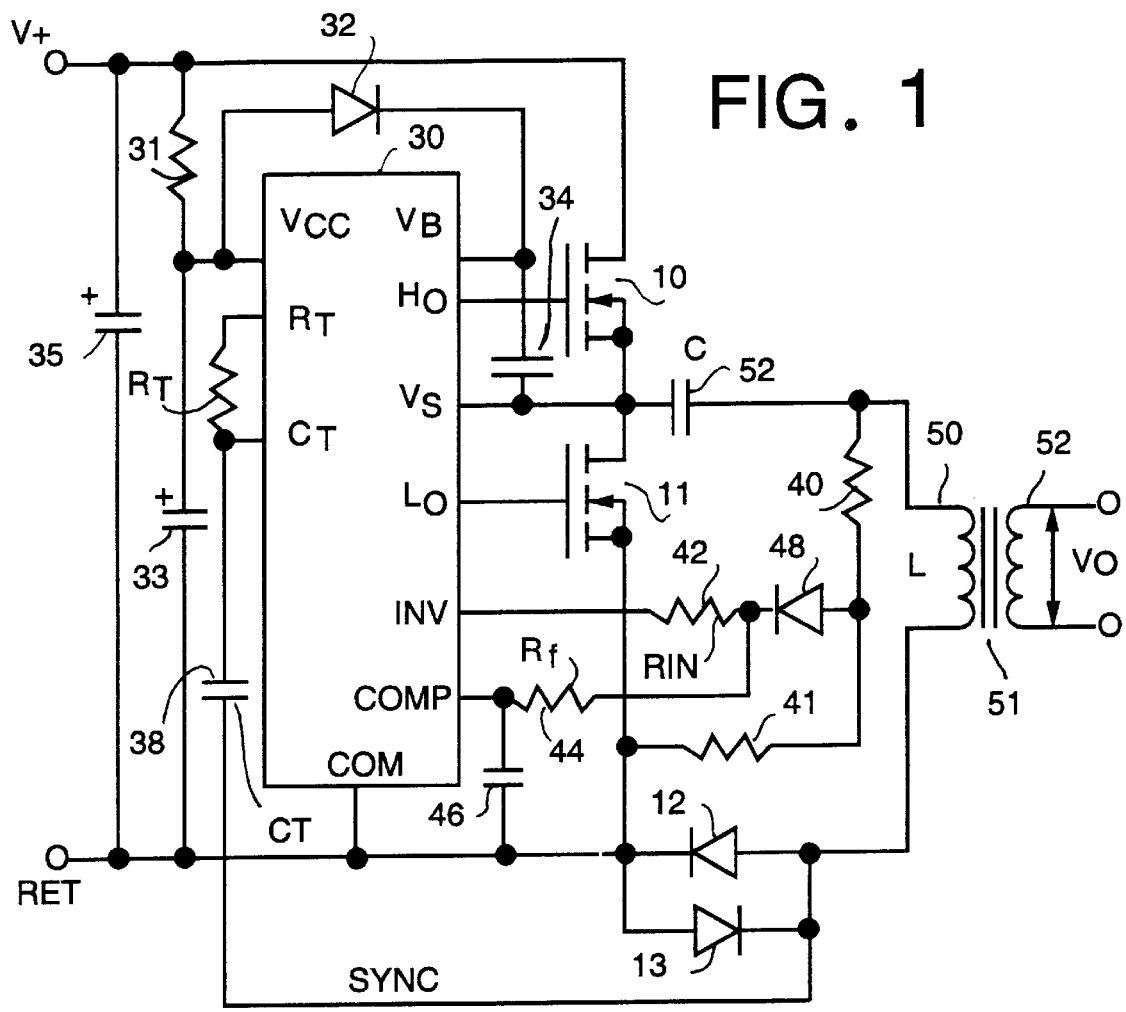
FIG. 1 is a block diagram showing a resonant-mode power supply circuit that includes an MGD integrated circuit according to an embodiment of the present invention.

FIG. 1 shows a partial block circuit diagram of a resonant power supply circuit that includes an MGD integrated circuit according to an embodiment of the present invention. More specifically, the circuit of FIG. 1 includes an MOS gate driver chip 30, which is similar to that of the IR 2155 driver but which is modified according to the present invention, and its associated circuitry for controlling the operation of a high side MOSFET 10 and a low side MOSFET 11. The MOS gate driver chip 30 provides drive signals to the MOSFETs 10 and 11 which are connected to d-c source terminals V+. Though power MOSFETs are shown, any power device which has a MOS gate, such as an IGBT or a MOS gated thyristor, may be substituted for power MOSFETs 10 and 11.

The output of the center tap of half bridge connected MOSFETs 10 and 11 drives a circuit that includes a series LC circuit comprised of inductor 50, which is the primary winding of transformer 51, and capacitor 52. The secondary winding 53 of transformer 51 supplies a voltage $V_0$ to a load circuit (not shown). Also provided are two back-to-back diodes 12 and 13 in series with inductor 50 and capacitor 52. Back-to-back diodes 12 and 13 form a zero crossing detector of the a-c current.

The voltage supplied at terminal V+ can range from 225 volts d-c to about 450 volts d-c, depending upon the supplied AC input voltage or the supplied PFC output voltage. Alternatively, terminal V+ may be supplied with a rectified a-c voltage.

The oscillating frequency of the output circuit is controlled by the resonant frequency of the inductor 50 and the capacitor 52 as well as by the zero crossing detector formed by back-to-back diodes 12 and 13. Diodes 12 and 13 are necessary to maintain the self-oscillation frequency of the output circuit at the true resonance frequency of the LC circuit 50 and 52, regardless of any small inductance changes which may be introduced by the load circuit, and to maintain the sinusoidal output voltage $V_0$. The inductance value of inductor 50 will depend on the value of voltage V+ and is selected so that the oscillation frequency of the circuit is within a desired range.

The chip 30 may be housed in a 10-pin DIP or surface mount package and has the following pinouts:

$V_{CC}$—a pin which receives a chip operating voltage from the d-c supply V+.

$C_T$—a single input control pin which is connected to the node between timing capacitor 38 and timing resistor 36. The other side of capacitor 38 is connected to the back-to-back diodes 12 and 13. The signal at pin $C_T$ controls both outputs $H_o$ and $L_o$.

$R_T$—a pin which is connected to the other terminal of timing resistor 36.

$V_B$—a pin connected to the node of diode 32 and capacitor 34, which acts as a "bootstrap" circuit to provide power for the operation of the high side switch.

$H_0$—an output pin to the gate of the high side MOSFET 10.

$V_S$—a pin to the center tap of the totem-pole or half bridge connected MOSFETs 10 and 11.

$L_0$—an output pin to the gate of the low side MOSFET 11.

COM—a pin connected to the negative or ground terminal RET of the d-c source.

In addition to the above, and in accordance with the present invention, the chip 30 also includes additional pinouts:

INV—a pin which receives a feedback voltage $V_{FB}$ that is supplied to an internal dead band controller.

COMP—a pin for providing an output of an error voltage $V_{COMP}$ generated by the dead band controller.

In further accordance with the present invention, a sensing circuit is provided and is comprised of a voltage divider formed of resistors 40 and 41, a diode 48 and another voltage divider formed of resistor 42 and feedback resistor 44. The sensing circuit provides the voltage $V_{FB}$, which is a fraction of the sensed voltage that is to be regulated, to the pin INV of chip 30. In this embodiment, the voltage is sensed across inductor 50 and back-to-back diodes 12 and 13.

The voltage $V_{FB}$ is supplied to an internal dead band controller within chip 30 which compares the voltage $V_{FB}$ to a built-in reference voltage and then generates an error voltage $V_{COMP}$ which is used by the chip 30 to control the dead time as a function of the error voltage.

Figure 2:
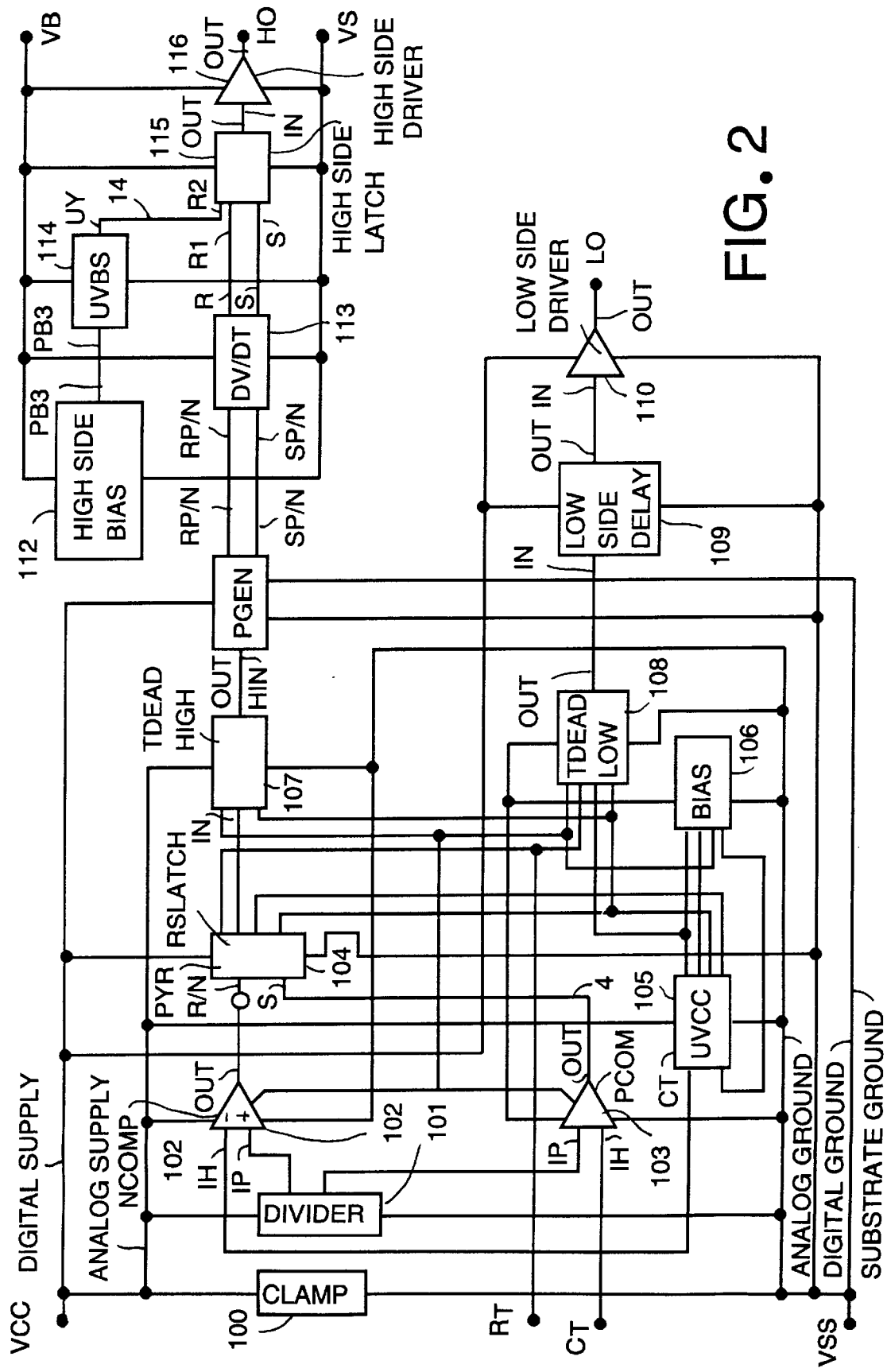
FIG. 2 is a block diagram showing a known MGD integrated circuit.

FIG. 2 is a block diagram of the circuit of a known MGD chip such as is described in the aforementioned U.S. Pat. Nos. 5,545,955 and 5,550,436 and which may be modified in accordance with the present invention and incorporated into the circuit of FIG. 1. All circuit blocks shown in FIG. 2 are incorporated in a common integrated circuit chip.

The first circuit block is the clamp circuit 100, consisting of a plurality of zener diodes. These are connected from pin $V_{CC}$ and pin $V_{SS}$ which is connected to the chip ground. A digital supply line and analog supply line both extend from pin $V_{CC}$. An analog ground line and a digital ground line are also connected to pin $V_{SS}$.

The next group of circuit blocks form a timer circuit. These include divider circuit 101 connected to the analog supply line to the analog ground, N comparator 102, P comparator 103 and an RS latch 104. Two taps from divider 101 are connected to the positive inputs of comparators 102 and 103. Input pin $C_T$ is connected to the negative input of comparator 103. The output of comparators 102 and 103 are connected to the RS latch 104 as shown.

The RS latch 104 is also connected to under-voltage lock-out circuit 105 which is integrated into the chip circuit. Thus, if $V_{CC}$ is too low, the RS latch 104 is locked out.

A bias circuit 106 provides bias outputs to the RS latch 104, the lockout circuit 105, and to dead time delay circuits 107 and 108 in the high side and low side circuit liens. Time delay circuits 107 and 108 provide a dead time or delay of about 1 microsecond between the turn on of the high side or low side switch after the turn off of the other. This dead time ensures that a "shoot through" circuit cannot be formed in which both power MOSFETs 10 and 11 are simultaneously on.

The output of dead time circuit 108 is applied to low side delay circuit 109 and low side driver 110 which is connected to pin $L_o$.

The output of dead time circuit 107 is applied to level shift pulse generator 111 in the high side output line. The high side line also includes a high side bias supply circuit 112 which drives a dv/dt filter circuit 113 which filters noise from the pulse passed by circuit 113, and an under-voltage analog lockout circuit 114. The input to the high side bias circuit 112 is connected to pin $V_B$.

The output of lockout circuit 114 and dv/dt filter 113 is applied to latch circuit 115 and its output is connected to buffer 116 which contains gain stages and drives pin $H_0$. Note that pin $V_{SS}$ is connected to circuits 113, 114, 115 and 116.

Figure 3:
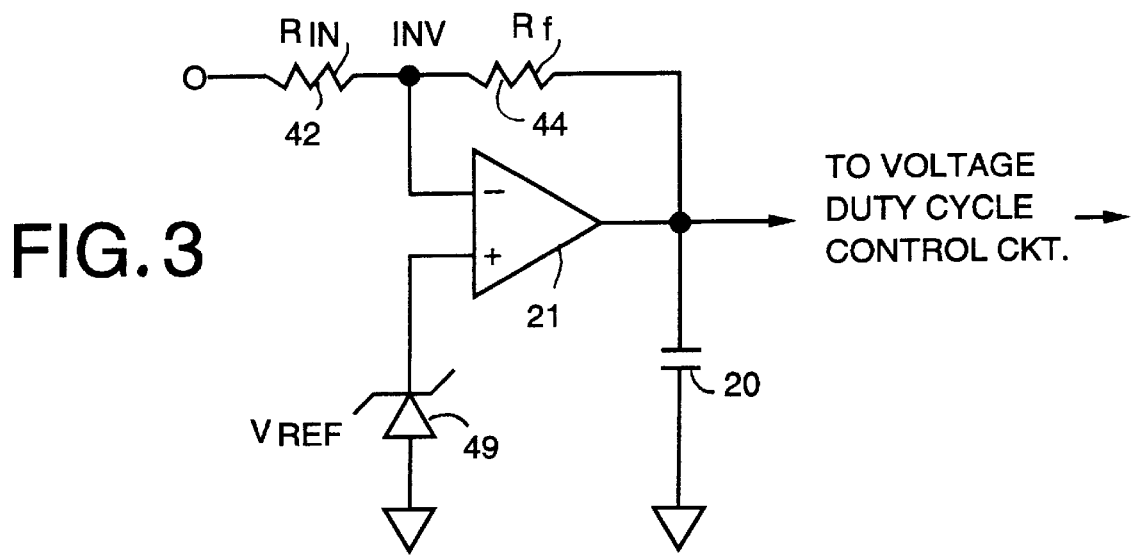
FIG. 3 is a diagram showing a dead band controller of the present invention.

FIG. 3 shows the dead band controller used in the circuit of FIG. 1 and that is incorporated into the MGD chip of FIG. 2, preferably on the same device substrate. The dead band controller regulates the dead band proportionality using an internally generated analog error signal. An input INV receives the voltage $V_{FB}$, which is a fraction of the voltage to be regulated, and supplies the voltage to a transconductance amplifier or comparator 21. Comparator 21 generates an error voltage $V_{COMP}$ by comparing voltage $V_{FB}$ against a built in reference voltage of, for example, +2.5V. The error voltage $V_{COMP}$ is outputted to control the dead time according to the relation:

$$V_{COMP} = K \times \text{DEAD TIME},$$

where K is a predefined proportionality constant. The dead time has a minimum value of 500 nsec and has a maximum value equal to ½f, where f equals the switching frequency. The corresponding range of $V_{COMP}$ for this frequency range is +1V to +5V. The analog output $V_{COMP}$ supplied by amplifier 21 is used to change the dead band between the Lo and Ho outputs that is supplied to MOSFETs 10 and 11 (or to other MOS-gated devices).

Frequency versus gain compensation is also obtained by the external capacitor 20 which is coupled between the output of the amplifier 21 and ground.

The dead band controller is electronically coupled to the internal circuitry shown in FIG. 2 so that a signal based on analog output $V_{COMP}$ is supplied to control the dead time. For example, a signal based on voltage $V_{COMP}$ is supplied to high side and low side dead time delay circuits 107 and 108, which may be modified to include an input that receives the signal, to control the dead time. Alternatively, a signal based on voltage $V_{COMP}$ is supplied to the high side level shift pulse generator 111.

In operation, the chip 30, shown in FIG. 1, modulates the output drive signals supplied to MOSFETs 10 and 11 in response to the size of the load across the secondary winding 53 of transformer 51 by varying the dead time of the output drive signals in proportion to the magnitude of the error output signal. For example, a small dead time, which is equivalent to a wide output pulse, is needed to compensate for a large output load whereas a large dead time, which is equivalent to a narrow output pulse, is needed to compensate for a light output load.

FIGS. 4A–4H illustrate the relation between the input control signals at pins $C_T$ and $R_T$ and the error voltage $V_{COMP}$ to the output drive signals Ho and Lo, shown on the same time scale. FIG. 4A shows the time variation of the potential at pin $C_T$, which oscillates between ⅔ $V_{CC}$ and ⅓ $V_{CC}$, and FIG. 4B shows the time variation at pin $R_T$. When the voltage at pin $C_T$ increases to ⅔ $V_{CC}$, pin $R_T$ changes from high to low, and the output at pin Lo is driven low, turning off the low-side power MOSFET 11. The voltage at pin $C_T$ also starts to decrease. After a timeout period equal to the dead time, the output at pin Ho is driven high and turns on high-side power MOSFET 10. When the voltage at pin $C_T$ reaches ⅓ $V_{CC}$, pin $R_T$ again goes high, and the output at pin Ho is driven low and turns off the high-side power MOSFET 10. After the timeout period, the output at pin Lo is driven high to again turn on low-side power MOSFET 11.

FIGS. 4C and 4D show the output drive signals at pins Lo and Ho, respectively, when the dead time is the minimum 500 nsec in response to the +1V threshold value of $V_{COMP}$ shown in FIG. 4E. By contrast, FIGS. 4F and 4G show the output drive signals at pins Lo and Ho, respectively, when the dead time is large in response to the higher value of $V_{COMP}$ shown in FIG. 4H. It should be noted that the maximum +5V value of $V_{COMP}$ results in a zero width signal at pins Lo and Ho. Thus, as shown in FIGS. 4C–4H, and as explained above, the dead time interval is adjusted for all output load ranges which would be encountered during normal operation of the MGD circuit.

Thus, the amplitude of output Vo shown in FIG. 1 is regulated by controlling the dead band or dead time shown in FIGS. 4E and 4H. Additionally, as Vo is loaded, the synchronizing circuit of diodes 12 and 13 shown in FIG. 1 always seek resonance and maintain a sinusoidal transformer voltage Vo.

Figure 5:
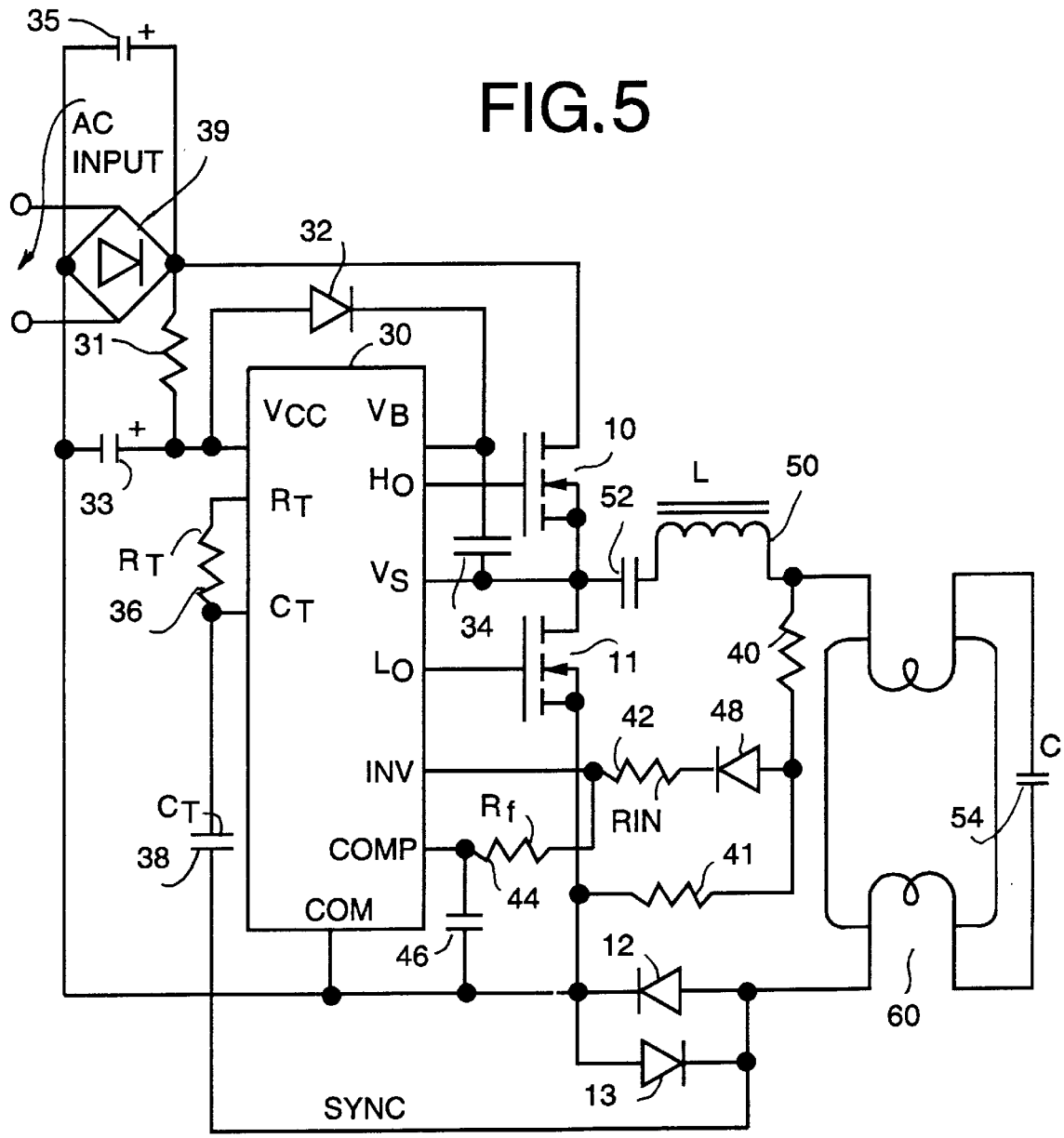
FIG. 5 shows an electronic ballast circuit according to another embodiment of the present invention.

FIG. 5 shows the novel monolithic MOS gate driver 30 of the present invention incorporated into the ballast circuit of a gas discharge lamp. The MGD 30 is supplied from a rectified ac input voltage supply 39. More specifically, the circuit of FIG. 5 has a gas discharge lamp 60 associated with the series LC circuit 50, 52 and 54. Two back-to-back diodes 12 and 13 are in series with the lamp circuit and form a zero crossing detector for lamp 60.

In operation, and before lamp 60 strikes, the resonant circuit consists of inductor 50 and both of capacitors 52 and 54. The capacitance of capacitor 54 is lower than that of capacitor 52 so that it operates at a higher a-c voltage than that of capacitor 52. This voltage on capacitor 54 strikes the lamp 60. After lamp 60 strikes, capacitor 54 is effectively short circuited by the lamp voltage drop, and the frequency of the resonant lamp circuit now depends on inductor 50 and capacitor 52.

In this embodiment, the sensing circuit senses the voltage across the lamp 60 and delivers a fraction of this voltage as $V_{FB}$ to pin INV of the driver chip 30. The chip 30 controls the dead band of the drive signals supplied to pins Ho and Lo as a function of the error voltage $V_{COMP}$, which is derived from the voltage $V_{FB}$ in the manner described above regarding FIG. 3. As a result, the voltage across lamp 60 is regulated in response to change in the load.

Figure 6:
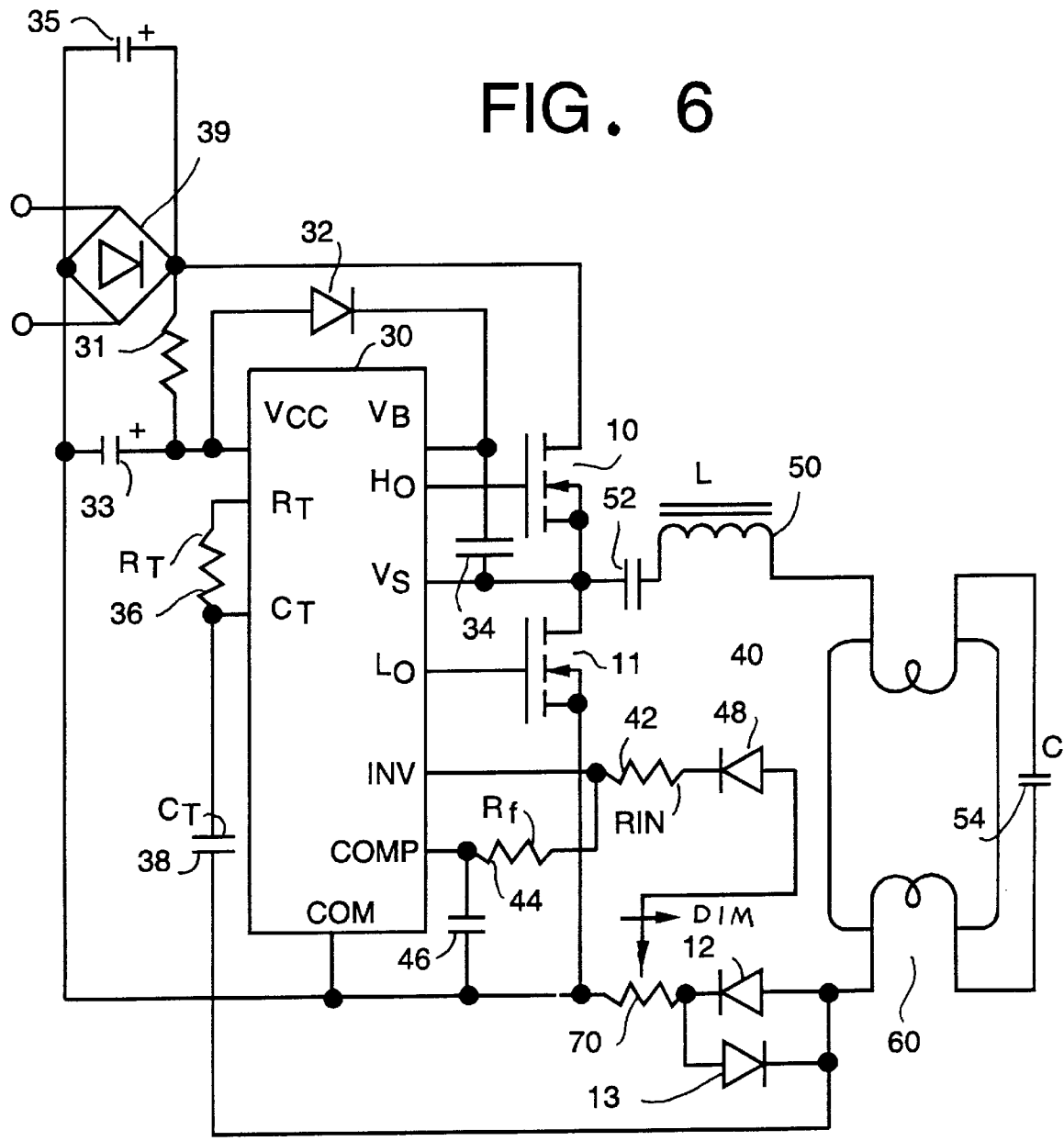
FIG. 6 shows an electronic ballast circuit according to a further embodiment of the present invention which includes dimming control.

A variation of the circuit of FIG. 5 is shown in FIG. 6 in which dimming is controlled by a variable resistor 70 that is inserted in series with the lamp 60. Here, the current through the lamp is sensed, rather than the voltage across the lamp, and a fraction of the voltage across resistor 70 is supplied to the pin INV to control the dead time of the drive signals Ho and Lo. As the connection from resistor 70 to resistor 42 is shifted as shown in FIG. 6, the voltage supplied to pin INV changes. The dead time of the driver circuit 30 is thus increased, and the on times of switches 10 and 11 are decreased. As a result, the lamp is dimmed.

Alternatively, a dimming control can be incorporated in the circuit shown in FIG. 5 by substituting a variable resistor for voltage divider 40 and 41.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An integrated circuit formed in a silicon substrate for driving first and second MOS gated power semiconductor devices which are connected in a half bridge circuit, said half bridge circuit having first and second d-c terminals and having a common terminal located at a node between said first and second MOS gated power semiconductor devices, the common terminal for supplying an output signal to a load circuit, said integrated circuit comprising:

a timer circuit having an input control terminal which is connectable to a low logic level signal;

a latch circuit coupled to said timer circuit for controlling the frequency at which said first and second MOS gated power semiconductor devices are switched on and off and for supplying an output which is switched in response to said signal applied to said input control terminal;

a high side dead time delay circuit and a low side dead time delay circuit each coupled to said latch circuit for delaying transmission of said latch output signal for a dead time interval following the switching of said output of said latch circuit to prevent simultaneous conduction of said first and second MOS gated power semiconductor devices;

a high side driver circuit and a low side driver circuit coupled to said high side dead time circuit and said low side dead time circuit, respectively, and having high side and low side output terminals, respectively, which supply outputs for turning on and off said first and second MOS gated power semiconductor devices in response to said signals supplied to said input control terminal; and a dead band control circuit for supplying a dead time control signal to said high side and low side dead time delay circuits in response to a feedback signal derived from said output supplied to said load circuit, said dead time control signal controlling the duration of said dead time interval such that, during normal operation, neither said first nor second MOS gated power semiconductor devices conduct during said dead time interval regardless of output circuit loading.

2. The integrated circuit of claim 1 wherein said feedback signal is a fraction of a voltage sensed from said output supplied to the load circuit.

3. The integrated circuit of claim 1 wherein said feedback signal is supplied by an external sensing circuit which senses a voltage from said output supplied to the load circuit.

4. The integrated circuit of claim 3 wherein said external sensing circuit includes at least one voltage divider.

5. The integrated circuit of claim 1 wherein said dead band control circuit comprises a transconductance amplifier which compares said feedback signal to a reference voltage and generates said dead time control signal based on said comparison.

6. The integrated circuit of claim 5 wherein said transconductance amplifier is frequency versus gain compensated by an external capacitor coupled between an output of said transconductance amplifier and a ground terminal.

7. The integrated circuit of claim 1 wherein said dead time control signal is proportional to said dead time interval.

8. The integrated circuit of claim 1 wherein the value of said dead time interval ranges from about 500 nsec to ½f, where f equals the switching frequency.

9. The integrated circuit of claim 1 wherein said timer circuit has a second input control terminal for controlling the frequency at which said MOS gated power semiconductor devices are turned on and off; said first and second input control terminals being connected to an external timing capacitor and an external timing resistor for setting the oscillation frequency of said timing circuit.

10. A power supply circuit for driving a load circuit, said circuit comprising:

first and second MOS gated power semiconductor devices connected in a half bridge configuration which has first and second d-c terminals coupled across the d-c bus supply and having a common terminal at the node between said first and second MOS gated power semiconductor devices for supplying an output signal to the load circuit;

a sensing circuit electrically coupled to said load circuit for generating a feedback voltage derived from said output supplied to said load circuit; and a self oscillating driver circuit having first and second outputs for driving said first and second MOS gated power semiconductor devices, respectively, a dead time delay circuit for preventing the simultaneous driving of said first and second MOS gated power semiconductor devices by delaying the turning on of one of said first and second MOS gated power semiconductor devices for a dead time interval after the turning off of another one of said first and second MOS gated power semiconductor devices, and a dead band control circuit for supplying a dead time control signal to said dead time delay circuit in response to said feedback voltage, said dead time control signal controlling the duration of said dead time interval such that, during normal operation, neither said first nor second MOS sated power semiconductor devices conduct during said dead time interval regardless of output circuit loading.

11. The circuit of claim 10 wherein said dead band control circuit modulates said output signal to the load circuit by generating said dead time control signal to change the duration of said dead time interval in response to the size of the load circuit.

12. The circuit of claim 10 further comprising a series LC circuit coupled across said common terminal and a ground terminal; wherein the oscillating frequency of the load circuit is controlled by the resonant frequency of said series LC circuit.

13. The circuit of claim 12 wherein said series LC circuit includes a capacitor and a primary winding of a transformer; the load circuit being coupled across a secondary winding of said transformer.

14. The circuit of claim 13 wherein said sensing circuit senses the voltage across said primary winding of said transformer of said series LC circuit.

15. The circuit of claim 12 further comprising a zero crossing detector coupled to said series LC circuit, said ground terminal and an input control terminal of said self oscillating driver circuit, said zero crossing detector maintaining said oscillation frequency of the load circuit at the resonance frequency of said LC circuit.

16. The circuit of claim 10 wherein said feedback signal is a fraction of a voltage sensed from said output supplied to the load circuit.

17. The circuit of claim 10 wherein said sensing circuit includes at least one voltage divider.

18. The circuit of claim 10 wherein said dead band control circuit comprises a transconductance amplifier which compares said feedback signal to a reference voltage and generates said dead time control signal based on said comparison.

19. The circuit of claim 18 wherein said transconductance amplifier is frequency versus gain compensated by an external capacitor coupled between an output of said transconductance amplifier and a ground terminal.

20. The circuit of claim 10 wherein said dead time control signal is proportional to said dead time interval.

21. A circuit for driving a gas discharge illumination device, said circuit comprising:

first and second MOS gated power semiconductor devices connected in a half bridge configuration which has first and second d-c terminals coupled across a dc bus supply and having a common terminal at the node between said first and second MOS gated power semiconductor devices for supplying an output signal to the illumination device;

a sensing circuit electrically coupled to said illumination device for generating a feedback voltage derived from said output supplied to said illumination device;

a self oscillating driver circuit having first and second outputs for driving said first and second MOS gated power semiconductor devices, respectively, a dead time delay circuit for preventing the simultaneous driving of said first and second MOS gated power semiconductor devices by delaying the turning on of one of said first and second MOS gated power semiconductor devices for a dead time interval after the turning off of another one of said first and second MOS gated power semiconductor devices, and a dead band control circuit for supplying a dead time control signal to said dead time delay circuit in response to said feedback voltage, said dead time control signal controlling the duration of said dead time interval such that, during normal operation, neither said first nor second MOS gated power semiconductor devices conduct during said dead time interval regardless of output circuit loading.

22. The circuit of claim 21 wherein said dead band control circuit modulates said output signal to the illumination device by generating said dead time control signal to change the duration of said dead time interval in response to the current in the illumination device.

23. The circuit of claim 21 further comprising a series LC circuit coupled across said common terminal and said illumination device; wherein the oscillating frequency of the illumination device is controlled by the resonant frequency of said series LC circuit.

24. The circuit of claim 23 further comprising a zero crossing detector coupled to said illumination device, said ground terminal and an input control terminal of said self oscillating driver circuit, said zero crossing detector maintaining said oscillation frequency of the illumination device at the resonance frequency of said LC circuit.

25. The circuit of claim 21 wherein said sensing circuit senses the voltage across said illumination device.

26. The circuit of claim 21 wherein said sensing circuit includes a variable resistor that controls the value of said feedback voltage, thereby comprising a dimming control.

27. The circuit of claim 21 wherein said feedback signal is a fraction of a voltage sensed from said output supplied to the illumination device.

28. The circuit of claim 21 wherein said sensing circuit includes at least one voltage divider.

29. The circuit of claim 21 wherein said dead band control circuit comprises a transconductance amplifier which compares said feedback signal to a reference voltage and generates said dead time control signal based on said comparison.

30. The circuit of claim 29 wherein said transconductance amplifier is frequency versus gain compensated by an external capacitor coupled between an output of said transconductance amplifier and a ground terminal.

31. The circuit of claim 21 wherein said dead time control signal is proportional to said dead time interval.

32. The circuit of claim 21 wherein said sensing circuit senses the current through said illumination device.

* * * * *